United States Patent [19]
Sokolich et al.

[11] Patent Number: 5,486,804
[45] Date of Patent: Jan. 23, 1996

[54] INTEGRATED MAGNETORESISTIVE SENSOR FABRICATION METHOD AND APPARATUS

[75] Inventors: Marko Sokolich, Los Angeles; Hiroyuki Yamasaki, Palos Verdes Estates; Huai-Tung Yang, Torrance, all of Calif.

[73] Assignee: Hughes Aircraft Company, Los Angeles, Calif.

[21] Appl. No.: 161,021

[22] Filed: Dec. 3, 1993

[51] Int. Cl.$^6$ ................................... H01L 43/00
[52] U.S. Cl. .............. 338/32 R; 338/32 H; 323/368
[58] Field of Search .............. 338/32 R, 32 H; 437/57, 63; 357/1, 2, 65, 27, 51; 323/293, 299, 368; 428/209

[56] References Cited

U.S. PATENT DOCUMENTS

| | | | |
|---|---|---|---|
| 3,852,103 | 12/1974 | Collins et al. | 338/22 R |
| 3,898,359 | 8/1975 | Nadkarni | 428/209 |
| 4,296,424 | 10/1981 | Shibasaki et al. | 357/1 |
| 4,401,966 | 8/1983 | Ohmura et al. | 338/32 R |
| 4,573,257 | 3/1986 | Hulseweh | 29/576 E |
| 4,681,657 | 7/1987 | Hwang et al. | 156/657 |
| 4,707,455 | 11/1987 | Tsang et al. | 437/57 |
| 4,978,938 | 12/1990 | Partin et al. | 338/32 R |
| 5,038,130 | 8/1991 | Eck et al. | 338/32 R |

FOREIGN PATENT DOCUMENTS

| | | |
|---|---|---|
| 0304280 | 2/1989 | European Pat. Off. |
| 0375107 | 6/1990 | European Pat. Off. |
| 0427171 | 5/1991 | European Pat. Off. |
| 0580207 | 1/1994 | European Pat. Off. |
| 91/14288 | 9/1991 | WIPO |

OTHER PUBLICATIONS

J. Electrochem. Society; Solid–State Science and Technology, Oct. 1984, "Growth of InSb and InAs$_{1-x}$SB$_x$ by OM–CVS", by P. K. Chiang and S. M. Bedair.

IEEE Electron Device Letters, vol. EDL-7, No. 4, Apr. 1986, "A GaAs Integrated Hall Sensor Amplifier" by T. R. Lepkowski, G. Shade, S. P. Kwok, Milton Feng, Lawrence E. Dickens, D. L. Laude, B. Schoendube.

MRL Bull, Res. Dev. vol. 2, No. 2 (1988), "Semiconductive Magnetoresistors" C. W. Wang, S. Yeh, M. T. Chu and S. H. Lee.

*Primary Examiner*—Tu Hoang
*Attorney, Agent, or Firm*—M. E. Lachman; M. W. Sales; W. K. Denson-Low

[57] ABSTRACT

A magnetoresistor is monolithically integrated with an active circuit by growing a thin film magnetoresistor on a semiconductor substrate after the substrate has been doped and annealed for the active devices. The magnetoresistor is grown through a window in a mask, with the mask and magnetoresistor materials selected such that the magnetoresistor is substantially non-adherent to the mask. InSb is preferred for the magnetoresistor, Si$_3$N$_4$ for the mask and GaAs for the substrate. The non-adherence allows the mask to be substantially thinner than the magnetoresistor without impairing the removal of the mask after the magnetoresistor has been established.

8 Claims, 3 Drawing Sheets

INTEGRATED MAGNETORESISTIVE SENSOR FABRICATION METHOD AND APPARATUS

BACKGROUND OF THE INVENTION

1. Field of the Invention

This invention relates to magnetoresistive sensors, and more particularly to methods for fabricating integrated magnetoresistive sensors and the resulting sensor structure.

2. Description of the Related Art

Varying magnetic fields have been used in the past as a sensing mechanism for moving parts, such as rotating elements in an automobile. The rotating element causes a magnetic field to periodically vary, and the rate of variation is sensed as an indication of the rotational speed and/or position.

A simplified system for measuring the rotational speed of a rotating element is shown in FIG. 1. A wheel or gear 2 has a plurality of spaced protruding teeth 4 and rotates below a magnet 6. A magnetoresistor 8 that is provided on its own substrate is positioned in the magnetic field 10 between the magnet and wheel, while amplification and (if desired) digitizing circuits are provided on one or more separate substrates 12 that are electrically connected to the magnetoresistor 8.

The rotating wheel 2 is formed from a magnetic material, and thus attracts the field from magnet 6. The magnetic field at the magnetoresistor 8 is strongest when one of the teeth 4 is located directly below magnet 6, thus minimizing the distance between the magnet and the wheel. As the wheel rotates the field tends to bend along with the movement of the tooth, and thus traverses a greater distance as the tooth moves away from the magnet. These effects produce a reduction in the magnetic field strength at the magnetoresistor 8, which reaches a minimum when the magnet 6 is midway between two teeth 4. The magnetic field strength at the magnetoresistor increases again as the next tooth approaches, reaching a maximum when that tooth is located directly below the magnet. The field strength at the magnetoresistor thus varies periodically as the wheel continues to rotate, causing the resistance of magnetoresistor 2 to fluctuate in a similar fashion. This results in a periodically varying output from the amplifier circuitry 12.

It would be less expensive and reduce the bulk and complexity of the apparatus if the magnetoresistor could be integrated with the output circuitry in a single monolithic structure. However, this has not be practical in the past. Magnetoresistors have commonly been grown in crystalline form, and then cleaved into individual resistor elements that are simply glued to respective substrates. Other magnetoresistor fabrication techniques are known in which the magnetoresistive element is monolithically grown on a substrate. For example, in U.S. Pat. No. 3,898,359 to Nadkarni, a thin film layer of antimony or arsenic is applied over a layer of indium on an insulating substrate that has been coated with chromium or nickel. The antimony or arsenic film is them chemically combined with the indium to form an InSb or InAs magnetoresistor. A series of transverse indium Hall effect shorting strips are formed on the upper surface of the magnetoresistor to short circuit the Hall fields that would otherwise be built up. In another monolithic magnetoresistor construction, an InSb magnetoresistor is epitaxially grown on a GaAs substrate for use in infrared focal plane arrays; Chiang and Bedair, "Growth of InSb and $InAs_{1-x}Sb_x$ by OM-CVD", *J. Electrochem. Society; Solid-State Science and Technology*, October 1984, pages 2422–2426. As with U.S. Pat. No. 3,898,359, this article discloses the fabrication of a magnetoresistor by itself, without any associated circuitry on the same substrate.

In fact, although GaAs is particularly suited as a substrate for InSb because it has thermal expansion characteristics that are very close to those of InSb, InSb is not compatible with the annealing of dopants in GaAs. This is because the annealing is typically performed at about 850° C., while InSb cannot withstand temperatures greater than about 450° C. This is a significant limitation in the achievement of a monolithically integrated magnetoresistor and processing circuit, since InSb is the most magnetosensitive material currently known. It would also not be feasible to grow an InSb magnetoresistor on the same substrate with an integrated circuit that has already been fabricated, since InSb is typically grown at about 400° C., while the ohmic contacts of an integrated circuit begin to degrade at temperatures above about 250° C.

Even if the temperature problems could be overcome, there are other serious obstacles to the monolithic integration of a magnetoresistor with associated output circuitry. To grow a magnetoresistor at a desired location on the substrate, the usual approach would be to provide a growth mask over the entire substrate, with a window at the desired location for the magnetoresistor. InSb would then be grown over the mask and onto the substrate through the window, followed by removing the mask and the overlying InSb to leave the magnetoresistor material only in the window area. However, an InSb magnetoresistor is typically about an order of magnitude thicker than a typical pattern mask, and a continuous layer of the InSb over the entire mask area would prevent the solvent from reaching and removing the mask and leaving a clean substrate surface. It would also not be feasible to grow InSb over the entire substrate and then etch away the unwanted areas, since the etchant would also attack the underlying GaAs.

A magnetosensitive device that is monolithically integrated with associated output circuitry is described in Lepkowski et al., "A GaAs Integrated Hall Sensor/Amplifier", *IEEE Electron Device Letters*, Vol. Edl-7, No. 4, April 1986, pages 222–224. This device, however, uses a Hall sensor rather than a magnetoresistor. The Hall sensor is formed from the GaAs substrate material itself, rather than from a separate magnetoresistor material such as InSb, and therefore does not face the temperature and growth obstacles described above. Although they are easier to integrate with output circuitry, Hall sensors are not as magnetically sensitive as magnetoresistors.

SUMMARY OF THE INVENTION

The present invention seeks to provide a method for fabricating a sensitive magnetoresistor such as InSb in a monolithic integrated structure along with output circuitry, without degrading either the magnetoresistor or the circuitry, and thereby achieving a substantially lower cost than prior magnetoresistive sensors without sacrificing performance.

To achieve these goals, a semiconductor substrate (preferably GaAs) is doped in the areas that are intended for active devices of the magnetoresistive output circuitry, and then subjected to a high temperature anneal. A mask is next formed on the substrate with a window at a desired magnetoresistor location, and a thin film magnetoresistor is grown within the window. The mask and magnetoresistor materials are selected so that the magnetoresistor does not adhere to the mask; preferred materials are $Si_3N_4$ for the mask and InSb for the magnetoresistor. This allows the magnetoresistor be grown to a substantially greater thickness than the mask, without interfering with the removal of the mask after the magnetoresistor has been grown. The mask is removed after an additional optional patterning of the magnetoresistor, and conductive contacts are then made to the doped areas to establish the active devices, and to interconnect the magnetoresistor with the active devices. Although a small residue of magnetoresistor material may form on the mask, it will not be enough to prevent a clean removal of the mask.

The magnetoresistor can be monolithically integrated with an output amplifier and digitizing circuit to produce a TTL (transistor-transistor logic) compatible output signal. A considerable improvement in signal-to-noise ratio is achievable, making the sensor more applicable to environments in which the signal generation is considered to be marginal for reliable operation. In addition, temperature compensation can be achieved by integrating a pair of resistors in close proximity on the chip, with one of the resistors magneto sensitive and the other relatively insensitive.

These and other features and advantages of the invention will be apparent to those skilled in the art from the following detailed description, taken together with the accompanying drawings.

DETAILED DESCRIPTION OF THE INVENTION

Figure 1:
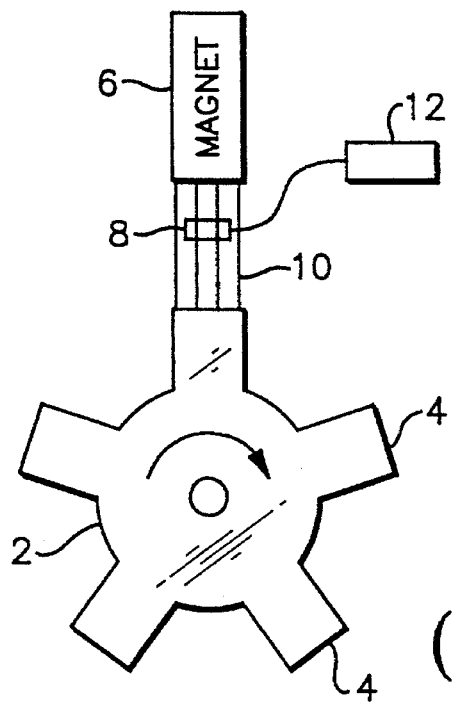
FIG. 1 is a simplified diagram of a known rotational speed sensor, described above, that uses a magnetoresistor.
Figure 2A:
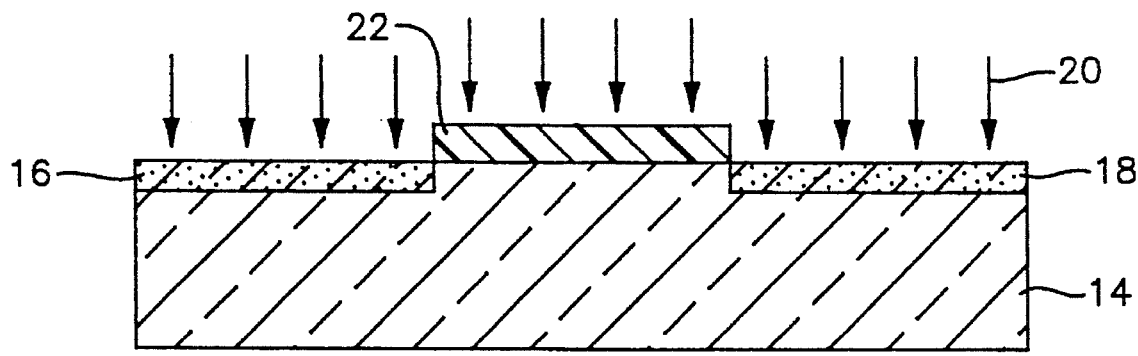
FIGS. 2a–2g are simplified and not-to-scale sectional views that illustrate sequential steps in the fabrication of a monolithically integrated magnetoresistor and output circuit in accordance with the invention.

One or more magnetoresistors are monolithically integrated with other circuitry on a common IC chip with a unique fabrication process, with the initial steps of the preferred embodiment illustrated in FIG. 2a. The structure is fabricated on a semi-insulating semiconductor substrate 14, which is preferably GaAs for the preferred InSb magnetoresistor. Other semiconductor substrate materials such as silicon and Indium Phosphide might also be used, although silicon and InSb have different thermal coefficients of expansion that can make their combination difficult, and InSb is a relatively more primitive state of development as a substrate material. Other magnetoresistive materials such as InAs can also be used, although InAs has a considerably lower magnetoresistivity than InSb. An InSb magnetoresistor on a GaAs substrate will be assumed hereinafter.

Areas of the substrate 14 that are intended for active electrical devices, indicated by numerals 16 and 18, are first doped to the desired conductivity. The doping is preferably performed by ion implantation, indicated by arrows 20, rather than by a higher temperature gaseous diffusion process. Areas of the substrate for which doping is not desired, such as the area to be occupied by the magnetoresistor, are protected from the implantation by a photoresist 22 or other suitable mask.

Figure 2B:
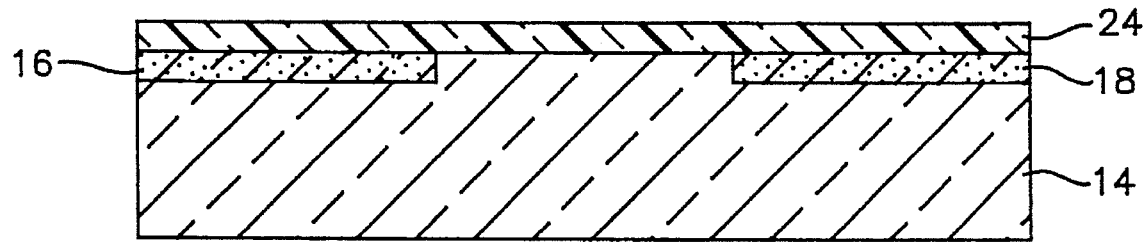
Figure 2C:
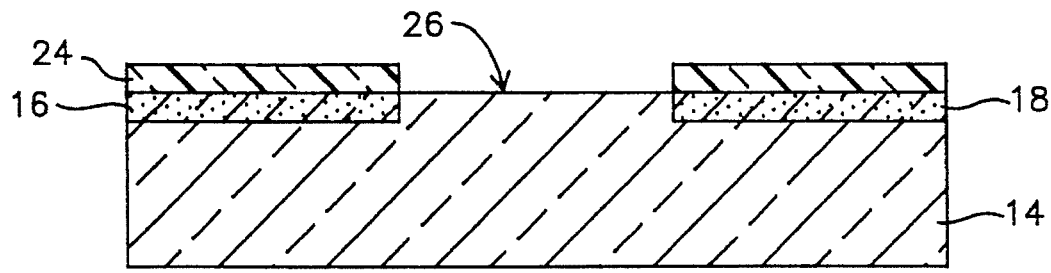

The wafer is next coated with a layer of silicon nitride ($Si_3N_4$) 24, as illustrated in FIG. 2b, and then annealed at a temperature of about 850°–890° C. to activate the dopant in the GaAs. The silicon nitride layer 24 is grown at a conventional pressure of about 650 m Torr and temperature of about 250°–350° C., and coats the entire wafer, generally to a thickness of only about 0.2 microns. It is then patterned with a suitable mask (not shown) over the doped areas 16 and 18, with an opening formed in the mask over the undoped area between the two doped areas where the magnetoresistor is to be formed. The unmasked silicon nitride layer is then removed, preferably with a dilute hydrofluoric acid etchant, to open a window 26 (shown in FIG. 2c) in the silicon nitride for the later formation of the magnetoresistor. The patterning mask over the remaining silicon nitride layer is then removed.

Figure 2D:
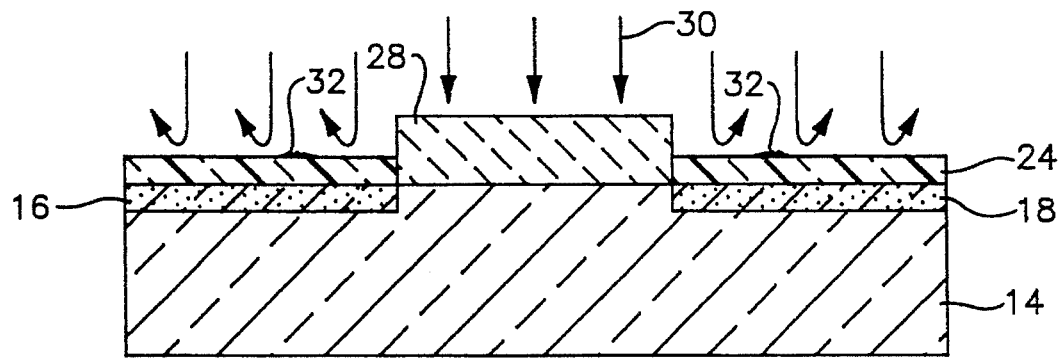

In the next step, illustrated in FIG. 2d, an InSb crystal 28 is grown in the silicon nitride window, preferably by metal organic chemical vapor deposition (MOCVD) at a temperature of about 380°–400° C., or alternately by molecular beam epitaxy (MBE), as indicated by arrows 30. The magnetoresistor material is grown within the window to a preferred thickness of about 2 microns. However, if the growth pressure is kept to not significantly more than 1 atmosphere, the InSb will not adhere to the surface of the silicon nitride layer 24. At most, only a small residue 32 of InSb will grow on the silicon nitride.

The choice of a mask material to which the magnetoresistive material will not adhere is an important aspect of the invention. The silicon nitride layer is normally only about 0.2 microns thick, as compared to the typical InSb thin film thickness of about 2 microns. Thus, if a continuous and substantially thicker InSb film were formed both in the window 26 and over the adjacent silicon nitride layer, the InSb would in effect seal the silicon nitride and inhibit access by a solvent that is used at a later stage in the fabrication process to remove the mask.

Figure 2E:
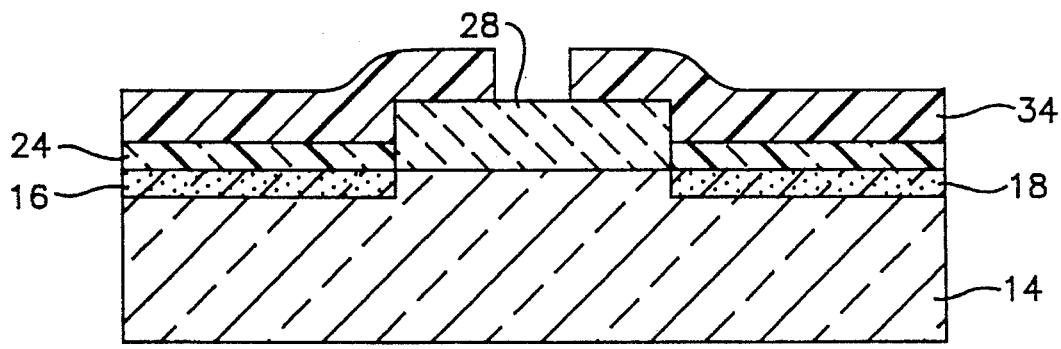

After the magnetoresistor 28 has been formed, it may be further patterned by coating the substrate with an etch mask 34 (illustrated in FIG. 2e) except where magnetoresistor removal is desired, and then etching away the unmasked portion. A combination of lactic and nitric acid is preferred for etching InSb. This etchant also attacks GaAs, although at a rate about 5–7 times slower than InSb. However, it is not a problem if the etchant degrades the GaAs surface within the window area, since this portion of the substrate is not used for any active devices.

Figure 2F:
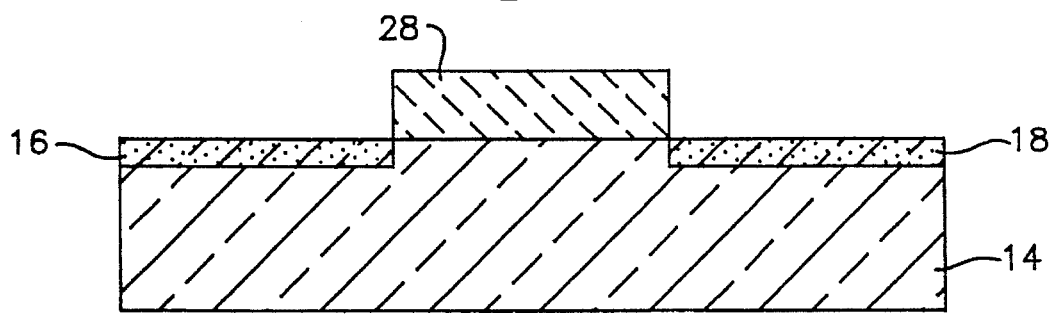

After any optional patterning of the magnetoresistor has been completed and the patterning mask 34 removed, the silicon nitride layer 24 over the doped substrate areas is removed, preferably with the same dilute hydrofluoric acid etch as mentioned above. Any small residue of InSb that may have formed on the silicon nitride will not be enough to interfere with the etch, and is simply washed away along with the silicon nitride. The resulting magnetoresistor 28 that has been monolithically integrated with the doped GaAs areas is illustrated in FIG. 2f.

Ohmic contacts to the GaAs, such as for source and drain contacts of a field effect transistor (FET), are then established. During this step with the magnetoresistor 28 and the remainder of the substrate are protected by a photoresist layer that is lifted off along with the overlying metal when the contacts have been established. A photoresist pattern is next laid down for the deposition of gate metal, along with contacts and shorting strips for the magnetoresistor; a preferred metal for this purpose is TiPtAu. A second metallization layer is then patterned to interconnect the contacts established with the first metallization layer, and additional metallizations may be built up if desired in a conventional manner.

Figure 2G:
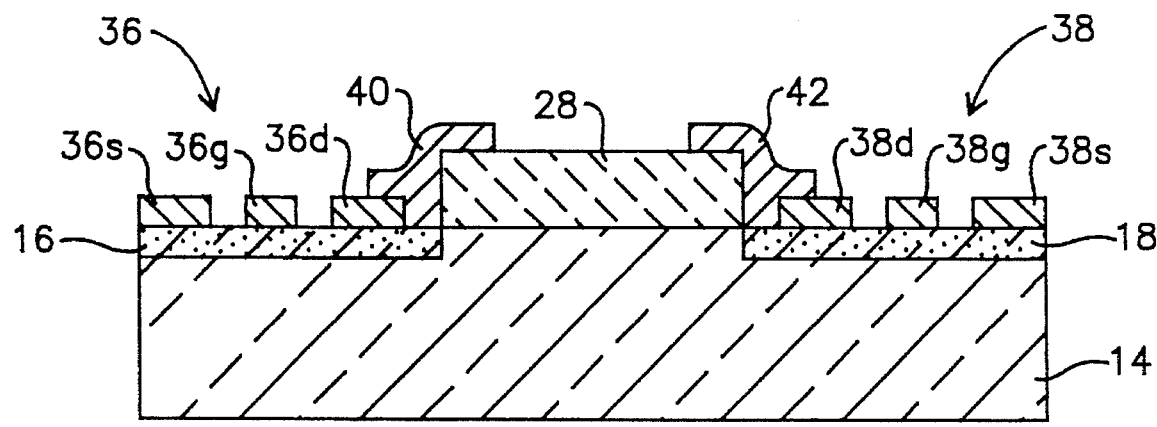

A completed magnetoresistor and pair of FETs that have been fabricated as a monolithic integrated structure in this fashion are illustrated in FIG. 2g. The FETs 36 and 38 include source contacts 36s and 38s, drain contacts 36d and 38d, and gate contacts 36g and 38g. The magnetoresistor 28 is shown connected to the transistor drains by metallized interconnects 40 and 42; for purposes of simplification the FET source and gate connections are not shown, nor is a passivation layer of silicon nitride that would normally coat the entire circuit. While FETs of only one conductivity are shown, complementary FETs of opposite conductivity could also be formed by an appropriate doping of the substrate prior to growing the magnetoresistor. For example, if FETs 36 and 38 are n-channel devices, p-channel FETs could also be fabricated by providing p-wells.

Figure 3:
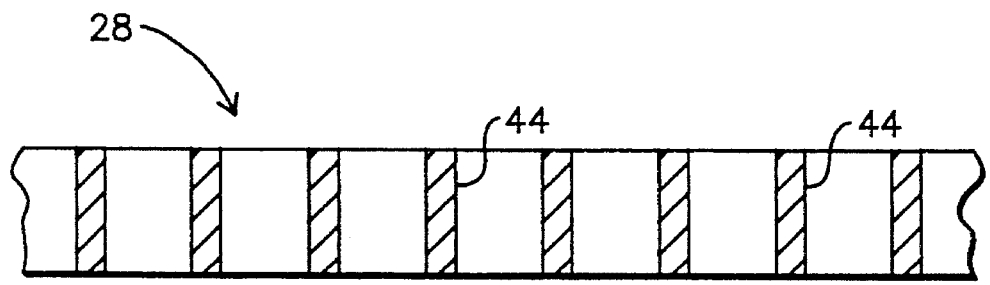
FIG. 3 is a plan view of a portion of a magnetoresistor.

A section of the magnetoresistor 28 is illustrated in FIG. 3, including the Hall effect shorting strips 44 that are formed in the same metallization step as the magnetoresistor contacts 40 and 42 in FIG. 2g. The magnetoresistor may have any desired shape; a serpentine shape is commonly used to minimize area requirements on the substrate.

Figure 4:
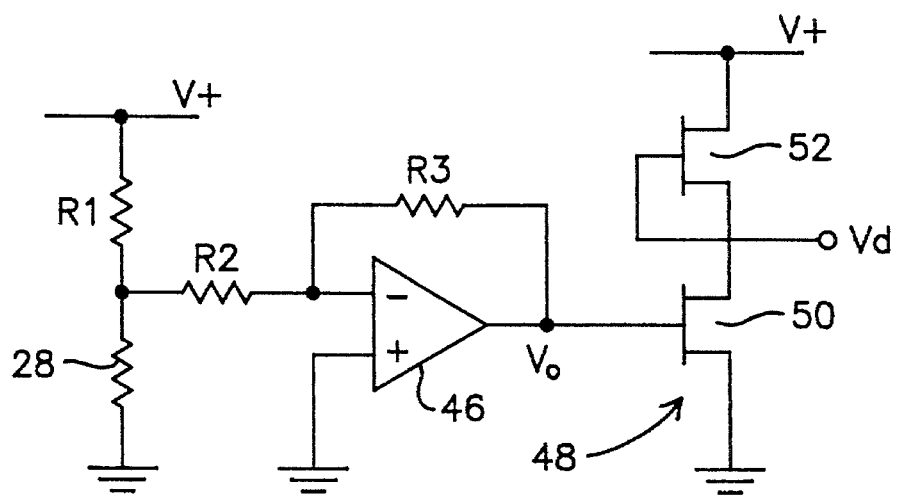
FIG. 4 is a schematic diagram of an amplifier/digitizing/temperature compensation circuit that can be monolithically integrated with a magnetoresistor in accordance with the invention.

FIG. 4 is a schematic diagram of a monolithic integrated magnetosensitive circuit that can be implemented with the invention. The circuit per se is known, and is described (except for its output digitizing section) in U.S. Pat. No. 5,308,130 to Eck et al., assigned to Hughes Aircraft Company, the assignee of the present invention. It includes the magnetoresistor 28 connected in series with a fixed resistor R1 in a voltage divider circuit between a positive bus v+ (typically 5 volts) and ground. A tap take between the magnetoresistor 28 and R1 is applied through a second resistor R2 to the inverting input of an operational amplifier 46, with a ground reference applied to the amplifier's non-inverting input and a feedback resistor R3 connected between its output and inverting input. The magnetoresistor 28 is intended to be positioned within a varying magnetic field, such that its resistance varies with the strength of the magnetic field at any given time. For a periodically varying magnetic field, the amplifier's output Vo will thus also vary periodically.

The fixed resistors R1, R2 and R3 are preferably also fabricated from InSb on the same substrate as magnetoresistor 28, but are not provided with Hall effect shorting strips. They are accordingly much less magnetically sensitive than the magnetoresistor 28 that does have the shorting strips, and for practical purposes may be considered to be magnetically insensitive. An advantage of fabricating both the fixed resistors and the magnetoresistor from the same material is that they have the same temperature coefficients; their resistance values vary with temperature in the same manner. As discussed in U.S. Pat. No. 5,038,130, this prevents a variance in the circuit operation that would otherwise result from the fixed resistors and magnetoresistor having different temperature coefficients.

The differential signal of R1 and magnetoresistor 28 is the input to the operational amplifier 46, while the amplifier's output Vo can be applied to a conditioning circuit such as the digitizing circuit 48 that consists of cascoded FETs 50 and 52. The output Vd of the digitizing circuit is a TTL (transistor-transistor logic) compatible square wave, with a frequency proportional to the rotational speed of the wheel or other magnetic element sensed by the magnetoresistor 28.

The use of a thin film magnetoresistor greatly reduces the costs associated with bulk magnetoresistive sensors, while its monolithic integration with related circuitry enhances the signal-to-noise ratio and allows the output signal to be amplified to a more manageable level. In addition, monolithic integration with GaAs circuits enhances the high temperature capability of the sensors because of the known high temperature durability of GaAs integrated circuits. The fabrication process described herein is readily adaptable to mass production techniques and has many applications, such as for antilock brake systems, transmission control systems and engine ignition control systems in the automotive field; these applications all require a magnetic sensing capability with high sensitivity and high reliability. While a particular embodiment of the invention has been shown and described, numerous variations and alternate embodiments will occur to those skilled in the art. Accordingly, it is intended that the invention be limited only in terms of the appended claims.

We claim:

1. A method of forming a magnetoresistor, comprising the steps of:

(a) providing a semiconductor substrate;

(b) forming a mask on said substrate, said mask having a window at the desired location of said magnetoresistor;

(c) depositing a layer of a magnetoresistive material on said substrate within said window wherein said magnetoresistive material is substantially non-adherent to said mask and said magnetoresistive material is deposited to a predetermined thickness; and (d) removing said mask to thereby form said magnetoresistor.

2. The method of claim 1 wherein the thickness of said mask is substantially smaller than said thickness of said magnetoresistive material.

3. The method of claim 1, wherein said layer of magnetoresistive material comprises a thin film.

4. The method of claim 3, further comprising the step of patterning the magnetoresistor within said window with an etchant to which said substrate is sensitive, and protecting said substrate lateral to said window from said etchant with said mask.

5. The method of claim 1, wherein a small residue of said magnetoresistive material is formed on said mask during said depositing, and said residue is removed along with said mask.

6. The method of claim 1, said magnetoresistive material comprising InSb and said mask comprising $Si_3N_4$.

7. The method of claim 6, wherein said semiconductor substrate comprises GaAs.

8. The method of claim 1 further including the step of forming Hall effect shorting bars on said magnetoresistor.

* * * * *